US006904920B2

(12) United States Patent
Bexten et al.

(10) Patent No.: US 6,904,920 B2
(45) Date of Patent: Jun. 14, 2005

(54) METHOD AND APPARATUS FOR CLEANING CONTAINERS (75) Inventors: Dan Bexten, Kalispell, MT (US); Jerry Norby, Kalispell, MT (US)

(73) Assignee: Semitool, Inc., Kalispell, MT (US)

( * ) Notice: Subject to any disclaimer, the term of this patent is extended or adjusted under 35 U.S.C. 154(b) by 373 days.

(21) Appl. No.: 10/043,716

(22) Filed: Jan. 9, 2002

(65) Prior Publication Data

US 2002/0100495 A1 Aug. 1, 2002

Related U.S. Application Data (63) Continuation of application No. 09/905,030, filed on Jul. 12, 2001, now abandoned, and a continuation-in-part of application No. 09/658,395, filed on Sep. 8, 2000, now Pat. No. 6,797,076, which is a continuation-in-part of application No. 09/113,440, filed on Jul. 10, 1998, now Pat. No. 6,432,214.

(51) Int. Cl.[7] ................................................. B08B 3/02
(52) U.S. Cl. ..................... 134/95.3; 134/99.2; 134/148; 134/153; 134/170
(58) Field of Search ............................... 134/94.1, 95.3, 134/99.2, 100.1, 103.1, 140, 148, 157, 166 R, 170, 153

(56) References Cited

U.S. PATENT DOCUMENTS

| | | | | | |
|---|---|---|---|---|---|
| 1,264,792 | A | * | 4/1918 | Hayward | 134/138 |
| 1,915,162 | A | * | 6/1933 | Klaiber | 134/141 |
| 2,197,382 | A | * | 4/1940 | Murphy | 137/565.31 |
| 2,562,076 | A | * | 7/1951 | Weisselberg | 134/139 |

(Continued)

FOREIGN PATENT DOCUMENTS

| | | |
|---|---|---|
| JP | 61-164225 A1 | 7/1986 |
| JP | 61-166134 A1 | 7/1986 |
| JP | 01-111338 | 4/1989 |
| JP | 01-199431 A1 | 8/1989 |

OTHER PUBLICATIONS

Drawing—STORM with Surfactant Aspiration—Jul. 10, 2000.

*Primary Examiner*—Frankie L. Stinson
(74) *Attorney, Agent, or Firm*—Perkins Coie LLP (57) ABSTRACT

A machine for cleaning containers such as flat media carriers has inside and outside arrays of nozzles arranged to spray a cleaning solution onto containers supported on a spinning rotor in a chamber. The cleaning solution, a mixture of water and a detergent or surfactant, is prepared by drawing out surfactant directly from a surfactant bulk storage vessel by means of a metering pump. The flow rate of the water is measured by a flow meter and in combination with the metering pump, a proper amount of surfactant is injected into the water line to produce a mixture with a desired surfactant concentration for removing contaminants. The mixture is injected into the water line at a mixing control valve to ensure that the water and surfactant are thoroughly mixed before being injected into the media carrier. Where the wafer carrier is provided with multiple rinse manifolds for spraying the carrier, a flow meter and mixing control valve are provided in the water inlet line for each manifold and a separate metering pump is provided for injecting surfactant into each water line to ensure that a proper amount of surfactant is injected into each water line to produce a surfactant/water mixture with a desired surfactant concentration.

19 Claims, 12 Drawing Sheets

U.S. PATENT DOCUMENTS

| | | | | |
|---|---|---|---|---|
| 2,669,999 A | * | 2/1954 | McMillan | 134/103.1 |
| 2,830,605 A | * | 4/1958 | Winningham et al. | 134/133 |
| 3,095,997 A | * | 7/1963 | Garvin | 221/180 |
| 3,240,216 A | * | 3/1966 | Sadwith | 134/80 |
| 3,448,744 A | * | 6/1969 | Szczepanski | 134/79 |
| 3,534,749 A | * | 10/1970 | Till | 134/152 |
| 3,620,234 A | | 11/1971 | Everroad | |
| 3,724,636 A | * | 4/1973 | Wright | 134/140 |
| 3,942,545 A | * | 3/1976 | Flynn | 134/46 |
| 4,299,245 A | | 11/1981 | Clapper | |
| 4,437,479 A | * | 3/1984 | Bardina et al. | 134/68 |
| 4,736,759 A | | 4/1988 | Coberly et al. | |
| 4,832,064 A | * | 5/1989 | Nezworski | 134/44 |
| 4,941,489 A | | 7/1990 | Kamimura et al. | |
| 5,022,419 A | | 6/1991 | Thompson | |
| 5,172,450 A | * | 12/1992 | Cole et al. | 15/302 |
| 5,183,513 A | * | 2/1993 | Sajewski | 134/22.12 |
| 5,218,988 A | * | 6/1993 | McNamara et al. | 137/101.21 |
| 5,224,503 A | | 7/1993 | Thompson et al. | |
| 5,238,503 A | * | 8/1993 | Phenix et al. | 134/37 |
| 5,271,774 A | | 12/1993 | Leenaars et al. | |
| 5,301,700 A | * | 4/1994 | Kamikawa et al. | 134/76 |
| 5,363,867 A | * | 11/1994 | Kawano et al. | 134/95.2 |
| 5,562,113 A | | 10/1996 | Thompson | |
| 5,637,103 A | * | 6/1997 | Kerwin et al. | 604/317 |
| 5,698,038 A | | 12/1997 | Guldi et al. | |
| 5,715,851 A | * | 2/1998 | Jung et al. | 134/155 |
| 5,738,128 A | | 4/1998 | Thompson | |
| 5,782,252 A | * | 7/1998 | Lewis et al. | 134/103.1 |
| 5,972,127 A | | 10/1999 | Thompson et al. | |
| 6,096,100 A | * | 8/2000 | Guldi et al. | 29/25.01 |
| 6,248,177 B1 | * | 6/2001 | Halbmaier | 134/2 |
| 6,267,123 B1 | * | 7/2001 | Yoshikawa et al. | 134/62 |
| 6,322,633 B1 | | 11/2001 | Bexten et al. | |
| 6,358,328 B1 | * | 3/2002 | Yang et al. | 134/21 |
| 6,412,502 B1 | | 7/2002 | Bexten et al. | |
| 6,446,647 B1 | | 9/2002 | Chu et al. | |

* cited by examiner

METHOD AND APPARATUS FOR CLEANING CONTAINERS

This Application is a continuation of U.S. patent application Ser. No. 09/905,030, filed Jul. 12, 2001 and now abandoned, which is a Continuation-in-Part of U.S. patent application Ser. No. 09/113,440, filed Jul. 10, 1998, now U.S. Pat. No. 6,432,214, and of U.S. patent application Ser. No. 09/658,395, filed on Sep. 8, 2000, and now U.S. Pat. No. 6,797,076. These Applications are incorporated herein by reference.

The field of the present invention relates to cleaning apparatus for rinsing and drying containers and carriers used to hold and process semiconductor wafers, substrates, flat panel displays and other flat media.

BACKGROUND OF THE INVENTION

Flat media, such as silicon or other semiconductor wafers, substrates, photomasks, flat panel displays, data disks, and similar articles require extremely low contamination levels. Even minute contaminants can cause defects. Accordingly, it is necessary to maintain a high level of cleanliness during all or nearly all stages of production of these types of flat media. The flat media described may be referred to below as "wafers", although it will be understood that "wafers" means any form of flat media.

Wafers are typically processed in batches. For example, in manufacturing semiconductor chips, for use in computers, telephones, televisions, and other electronic products, silicon wafers will undergo many batch processing steps, such as oxidation, photolithography, diffusion, chemical vapor deposition, metallization and etching. Batch handling may occur throughout the entire production process, or for one or more processing steps or related handling operations. Batch processing of this type almost always utilizes some type of carrier or container to hold the wafers being processed.

A wafer carrier or container holds a group of wafers. The wafer carriers can be of various designs, and may be more specifically referred to as a wafer boat. In many applications, they are made of a suitable polymeric material, e.g., polypropylene or TEFLON® fluoropolymer. The sides and sometimes the bottom of the wafer boat have receiving slots formed to receive and hold the wafers in a spaced array with the faces of the wafers adjacent to one another. Typically, the central axes of the wafers are aligned. The wafers are slid into the carrier or container, such as from the side or above, and are removed by sliding them outwardly. The receiving slots are shallow so that the wafer is engaged only at the peripheral edges and along a thin marginal band extending inwardly from the periphery.

Wafer carriers can also be provided in the form of a protective case or box in which the wafers are held and are sealed against contamination during travel within the processing facility. Wafer carriers of this type are frequently designed to hold a wafer boat having a complementary design. The complementary relationship of the protective wafer carrier box and the wafer carrier boat allow the boat and supported wafers to be fully enclosed and securely held in place during transport. The term "carrier" referred to below means a carrier, a container, with or without a lid, or a wafer boat.

At certain stages in the manufacturing process, the wafer carriers must be cleaned. Cleaning them is difficult because they typically have features which include slots, grooves or apertures, and inside corners which can trap contaminants. The difficulty in cleaning is enhanced by the extremely low contamination levels which are required for processing the wafers.

Accordingly, cleaning of wafer carriers remains a difficult, time consuming and relatively costly procedure. Sticky-back labels, fingerprints, dust, metal particles, photoresist and organic chemicals may also contaminate the wafer carriers.

Various machines have been made and used for cleaning wafer carriers. In these machines, the carriers are mounted on a rotor and spin within a chamber, while cleaning solutions are sprayed onto the carriers. The spinning movement minimizes process time and also helps in drying the carriers. In certain applications, a surfactant is introduced and mixed with de-ionized water, at a concentration of approximately 1:10,000. Used in this way, the surfactant acts as a wetting agent which helps to remove loosely adhered particles. Typically the surfactant is used only once and then discarded as waste.

The surfactant is typically held in a vessel from which it must be transferred into the wafer carriers during the cleaning process. Since the surfactant stream is applied in such a small flow volume so as to produce the desired small concentration level, it is difficult to control volume flow of the surfactant into the carriers. In one system as described in U.S. patent application Ser. No. 09/113,440, surfactant is pumped from the bulk storage vessel into a holding tank where it is diluted to a desired level. The diluted surfactant solution is then drawn out of the holding tank by a venturi into the water stream where it is mixed or aspirated with the water. The water and surfactant mixture is then directed to the rinsing manifold ready for injection into the wafer carrier.

Accordingly, it is an object of the invention to provide an improved machine for cleaning carriers and containers for flat media.

SUMMARY OF THE INVENTION

The present invention is directed to an apparatus for cleaning flat media carriers. A rotor is rotatably mounted within a chamber. Nozzles within the chamber are arranged to spray a washing mixture of water and a detergent or surfactant onto carriers supported on the rotor. The washing mixture is prepared by drawing out surfactant directly from a surfactant bulk storage vessel by means of a metering pump. The flow rate of the water is measured by a flow meter and in combination with the metering pump, an proper amount of surfactant is injected into the water line to produce a mixture with a desired surfactant concentration for removing contaminants.

In a second aspect of the invention, the surfactant solution is injected into the water line at or upstream of an inline mixing control valve to ensure that the water and surfactant are thoroughly mixed before being injected into the wafer carrier.

In a third aspect of the invention, where the wafer carrier is provided with multiple rinse manifolds for spraying the carrier, a flow meter is provided in the water inlet line for each manifold and a separate metering pump is provided for injecting surfactant into each water line to ensure that a proper amount of surfactant is injected into each water line to produce a mixture with a desired surfactant concentration.

BRIEF DESCRIPTION OF THE DRAWINGS

Other objects and features will become apparent from the following detailed description taken in connection with the accompanying drawings. However, the drawings are provided for purpose of illustration only, and are not intended as a definition of the limits of the invention.

In the drawings, wherein the same reference numbers denote the same elements throughout the several views.

DETAILED DESCRIPTION OF THE DRAWINGS

Figure 1:
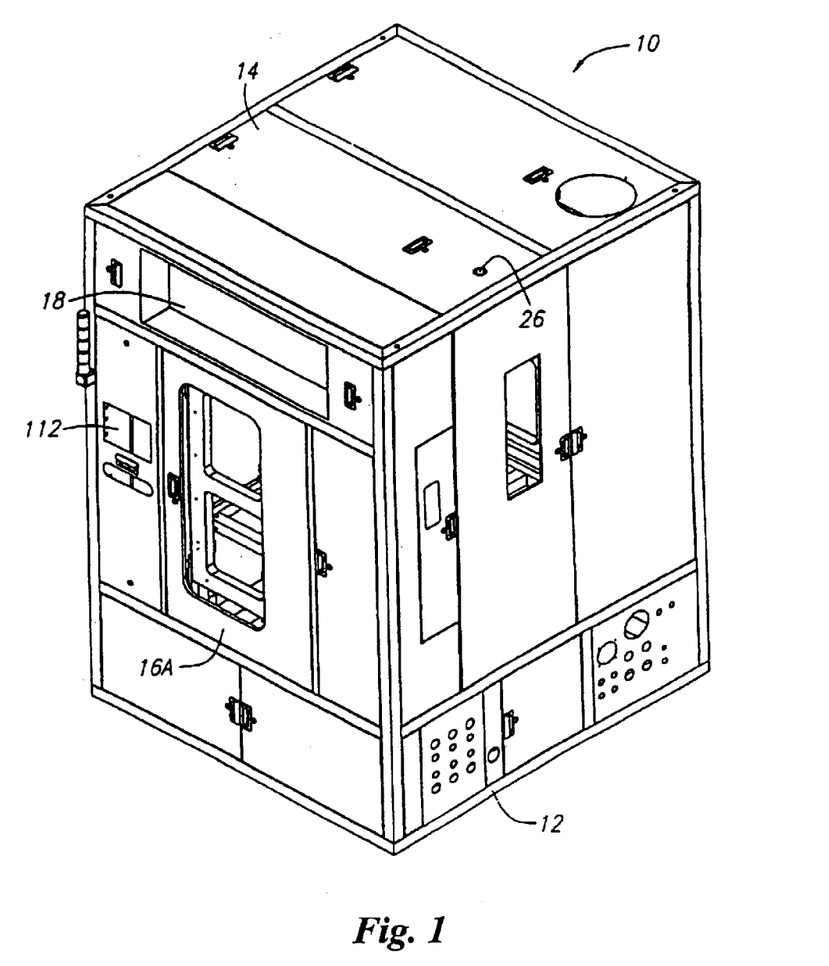
FIG. 1 is a front, top and right side perspective view of the present cleaning apparatus.
Figure 2:
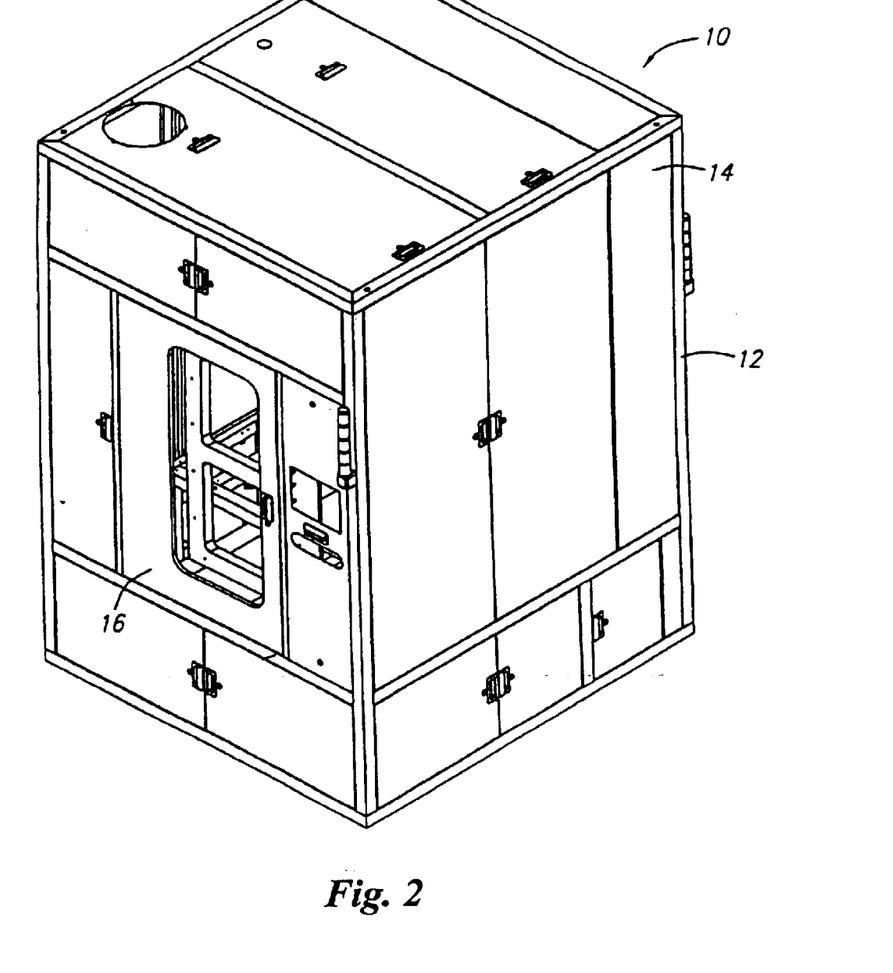
FIG. 2 is a back, top and left side perspective view thereof.

Turning now in detail to the drawings, FIGS. 1 and 2 illustrate a carrier cleaning machine 10 having a frame 12 and housing panels 14 forming an enclosure. A back door 16 and front door 16A are provided on the front and back surfaces of the machine 10. The machine 10 is generally installed in a clean room, of the type used in manufacturing semiconductors. An air filter enclosure 18 is located above the front door 16A, and contains a filter which filters clean room air. An exhaust duct 26 extends out of the top of the machine 10, at the back right corner, and is ordinarily connected to a facility or building exhaust duct.

Figure 3:
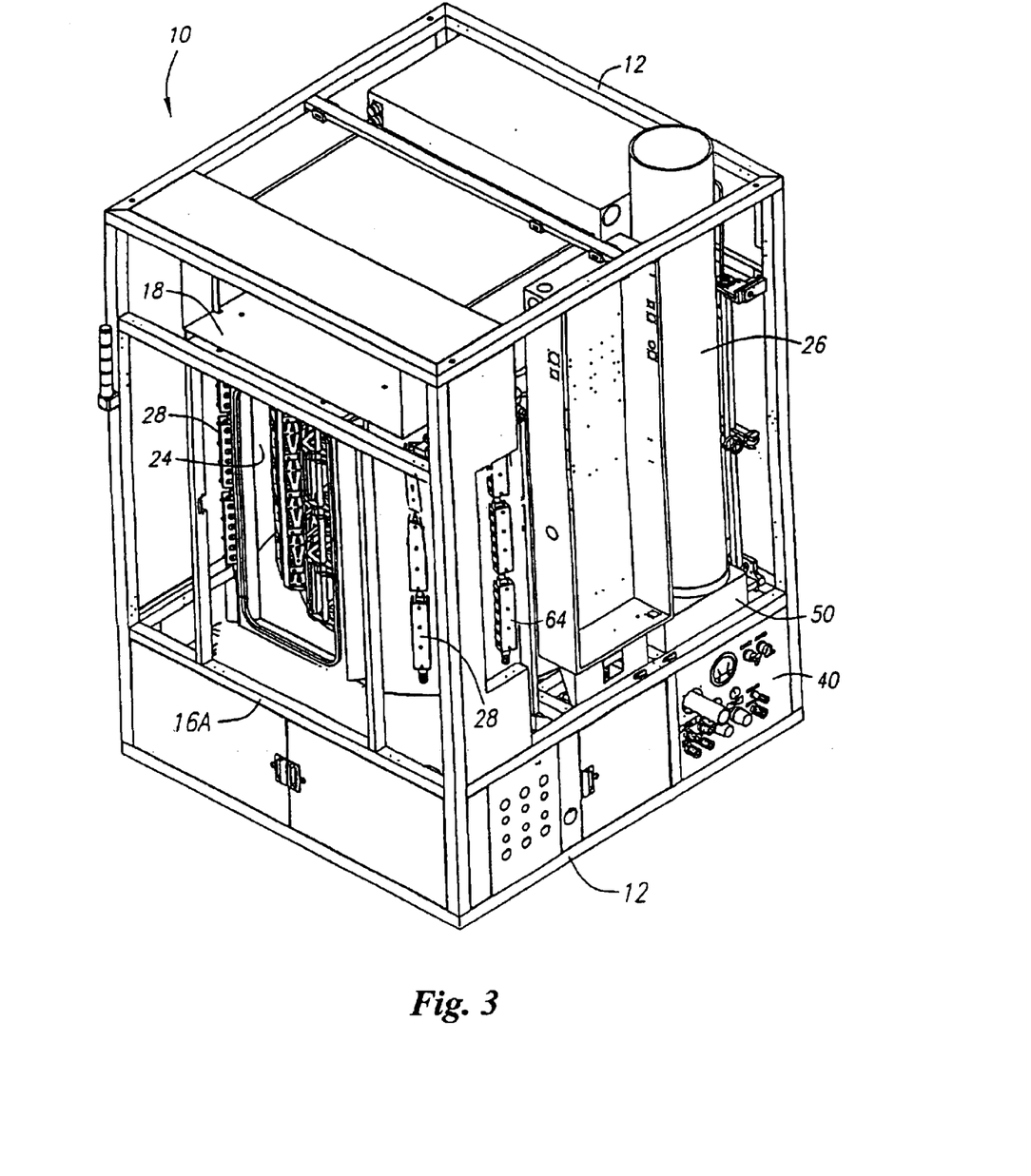
FIG. 3 is a front, top and right side perspective view of the apparatus shown in FIGS. 1 and 2, with the covers removed.
Figure 4:
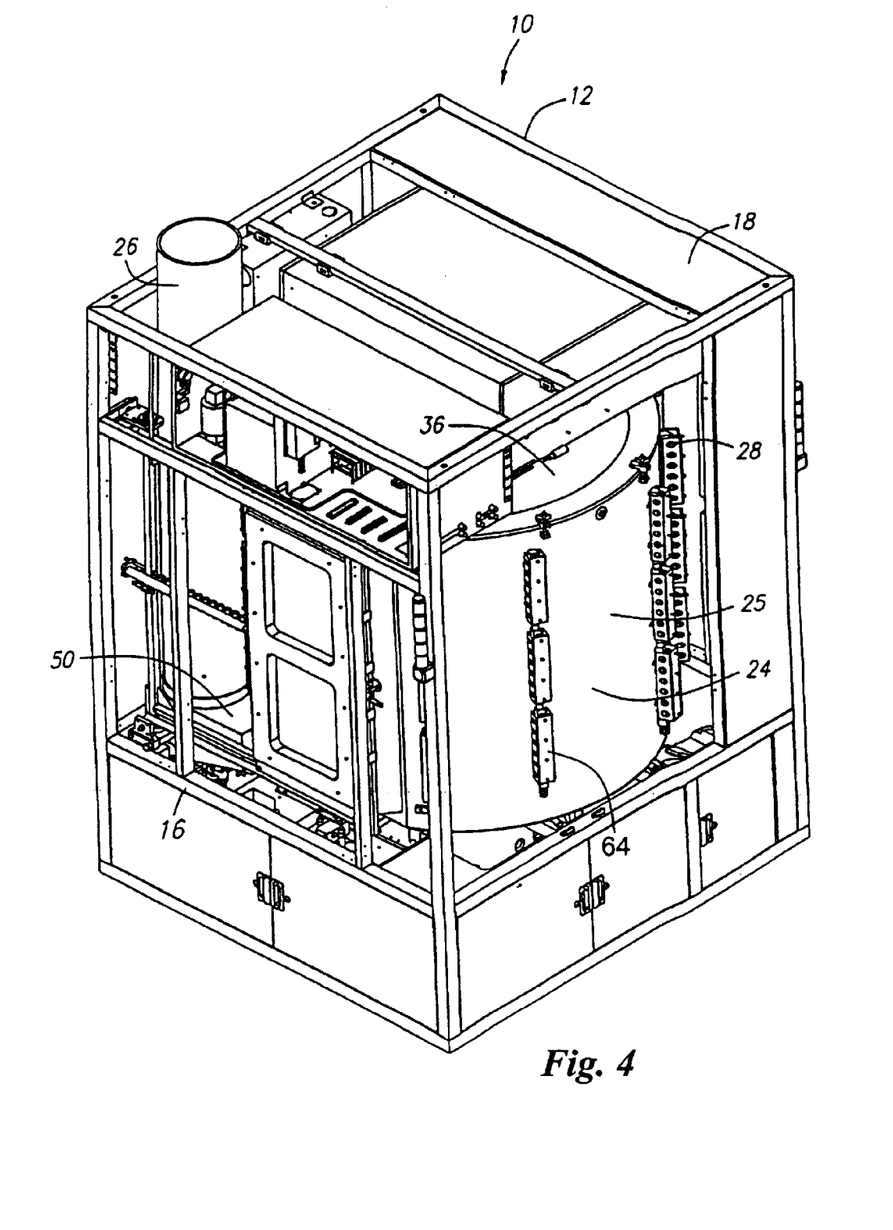
FIG. 4 is a back, top and left side view thereof.
Figure 6:
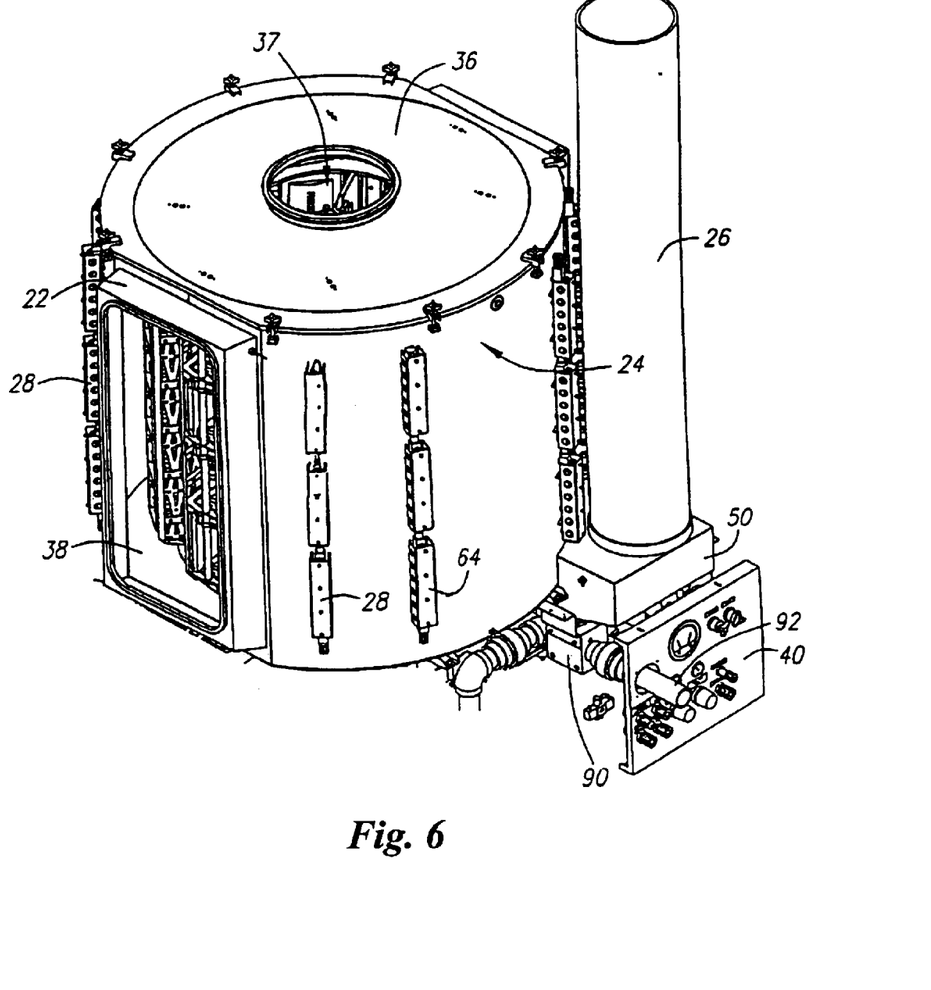
FIG. 6 is a front, top and right side perspective view of certain major components of the apparatus shown in FIGS. 1–5.
Figure 7:
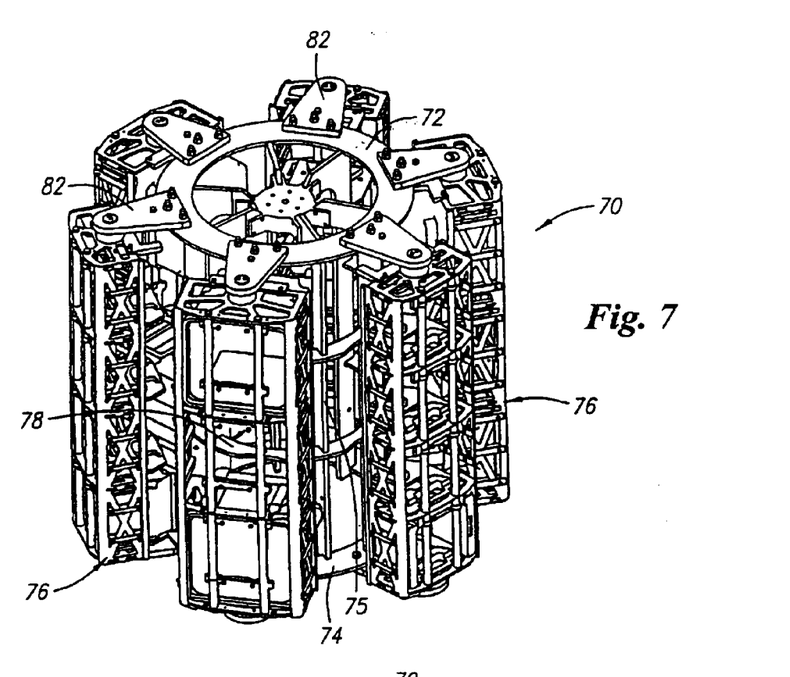
FIG. 7 is a perspective view of the rotor removed from the chamber.
Figure 8:
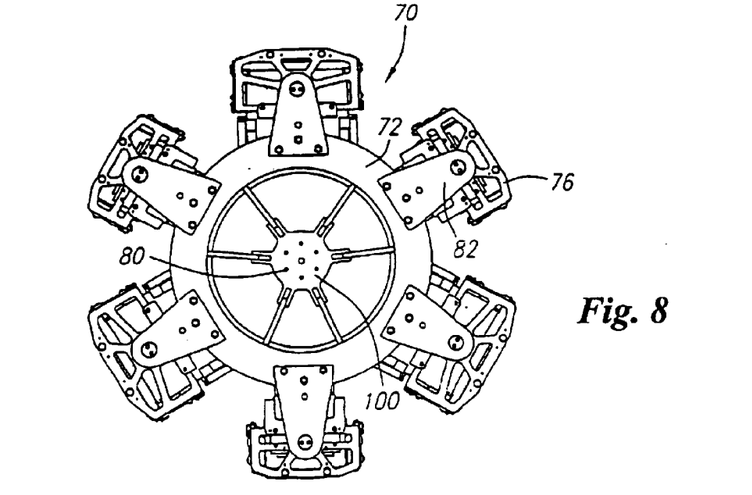
FIG. 8 is a plan view thereof.
Figure 9:
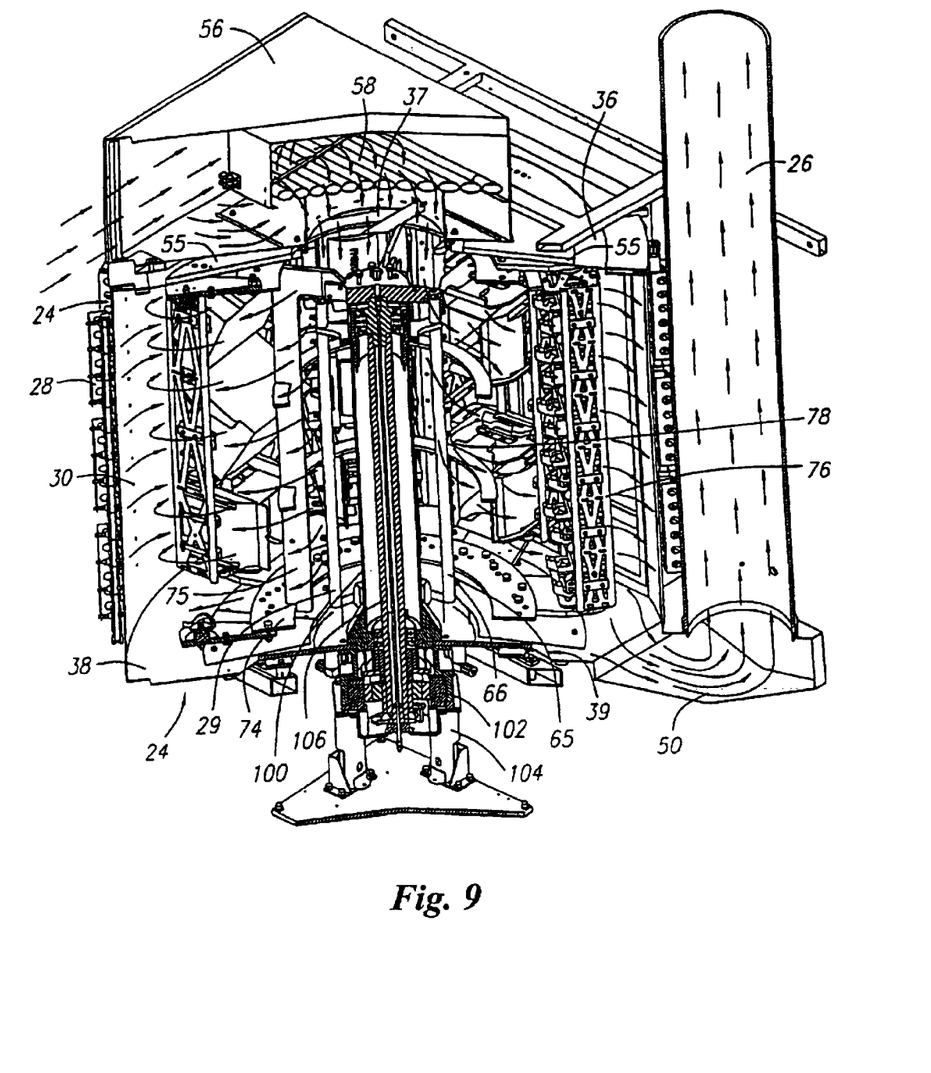
FIG. 9 is a section perspective view illustrating air movement through the apparatus.

Referring to FIGS. 3, 6 and 9, a cylindrical chamber 24 is supported within the frame 12. The chamber 24 has cylindrical side walls 25 and is closed off on the top and bottom by a top plate 36 and a bottom plate 38. The top plate 36, has a central opening 37 so that air passing through the filter box 18 can flow into and downwardly through the chamber 24. An exhaust plenum 50 at the lower back and right side of the chamber 24 connects to the exhaust duct 26, for moving air out of the chamber 24. A drain opening 39 at a low point of the chamber 24, in the exhaust plenum 50 drains fluids out of the chamber.

Figure 5:
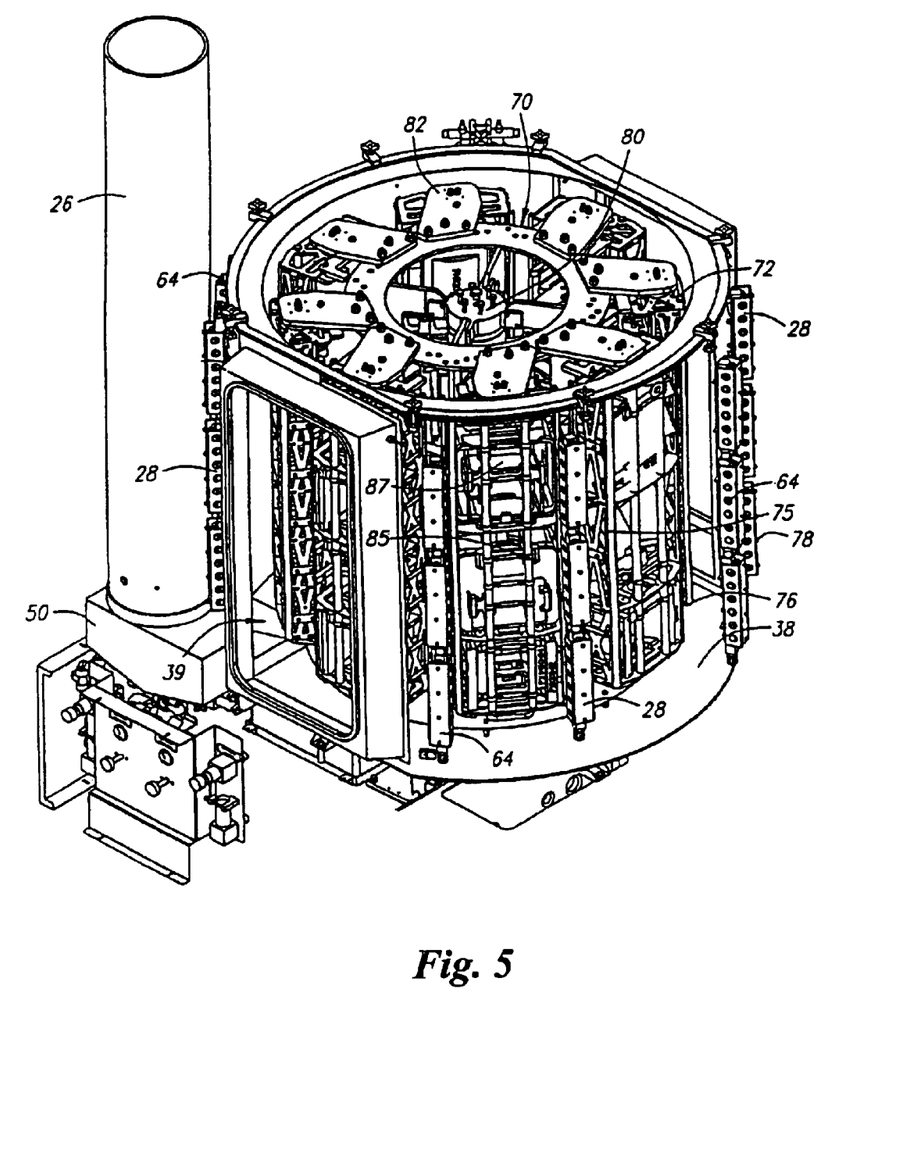
FIG. 5 is a back, top and left side perspective view with various components removed for purposes of illustration.
Figure 13:
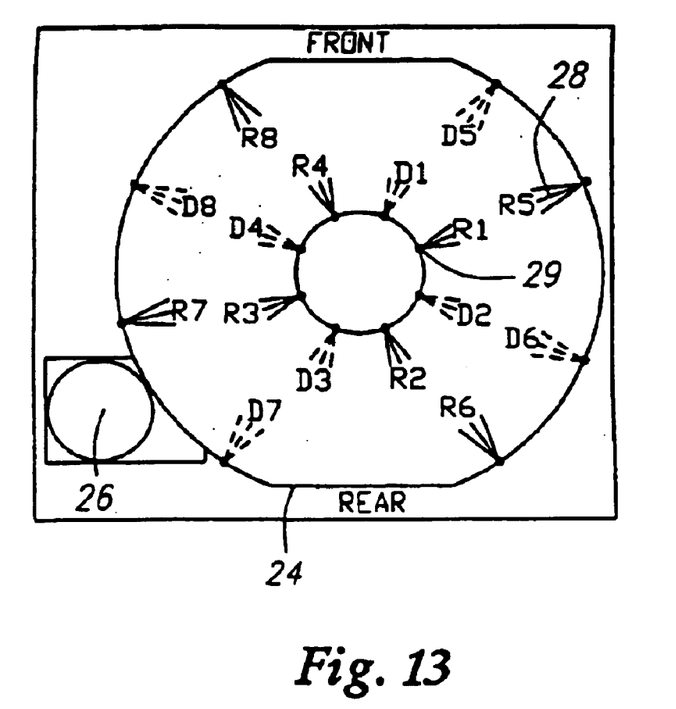
FIG. 13 is a schematically illustrated top view showing orientations of spray manifolds and nozzles.

Referring to FIGS. 5, 9 and 13, outer rinse manifolds 28 (R1–R4), each having e.g., 12 spray nozzles, are positioned around the outside circumference of the chamber 24, on the chamber cylindrical side walls 25. The outer rinse manifolds 28 may be located on the outside of the cylindrical side walls 25, as shown in FIGS. 4–6 and 10, or may be on the inside surface of the cylindrical side walls 25, so long as the rinse spray nozzles 30 on the outer rinse manifolds 28 are appropriately positioned to spray the work pieces, i.e., the wafer carriers.

Inner rinse manifolds 29 are positioned near the center of the chamber 24, with each inner rinse manifold (R5–R8) having a plurality of rinse spray nozzles 30 oriented to spray outwardly onto the work pieces (i.e., wafer carriers, containers or lids).

Similarly, outer dry manifolds 64 (D5–D8), each having a plurality of dry spray nozzles 66, are spaced apart around the circumference of the chamber 24, on the chamber cylindrical side walls 25. Inner dry manifolds 65 (D1–D4), each also having a plurality of dry spray nozzles 66 are positioned near the center of the chamber 24. A preferred orientation of the dry manifolds (D1–D8) and the rinse manifolds (R1–R8) is shown in FIG. 13.

Figures 10, 10A:
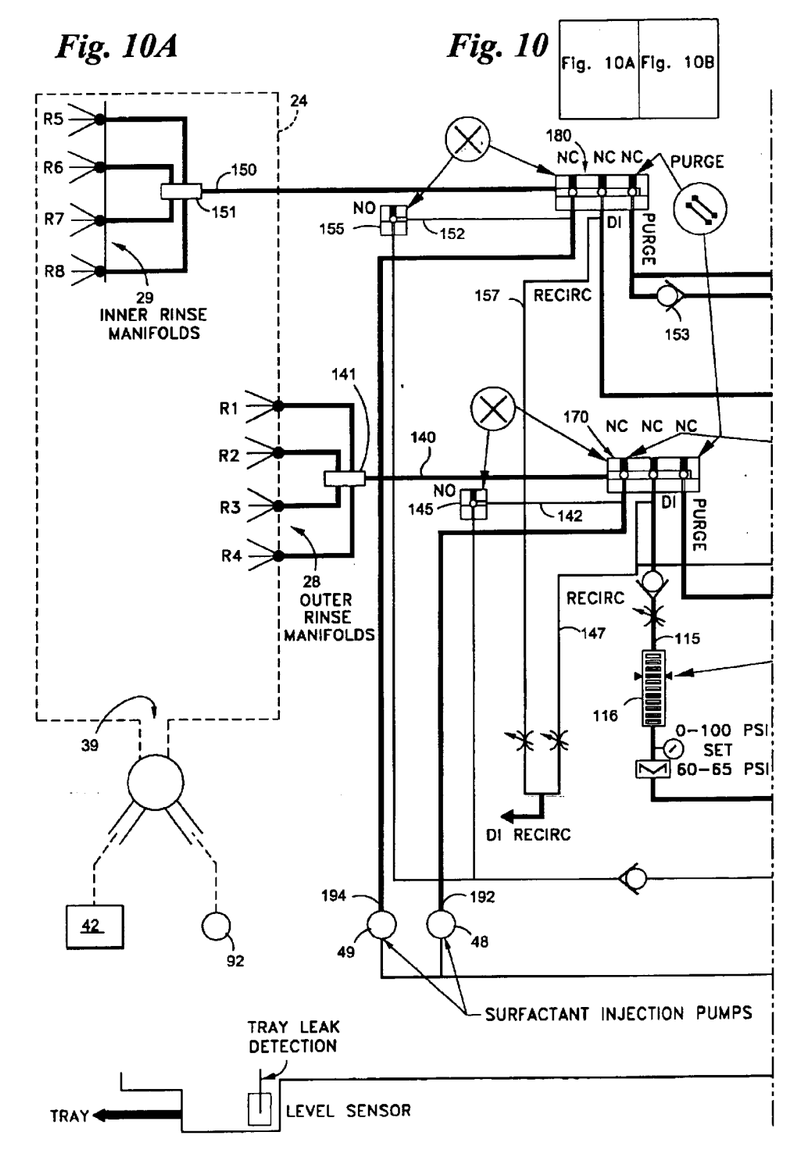
FIG. 10 is a schematic diagram showing fluid flow and interconnections in the present machine.
Figure 10B:
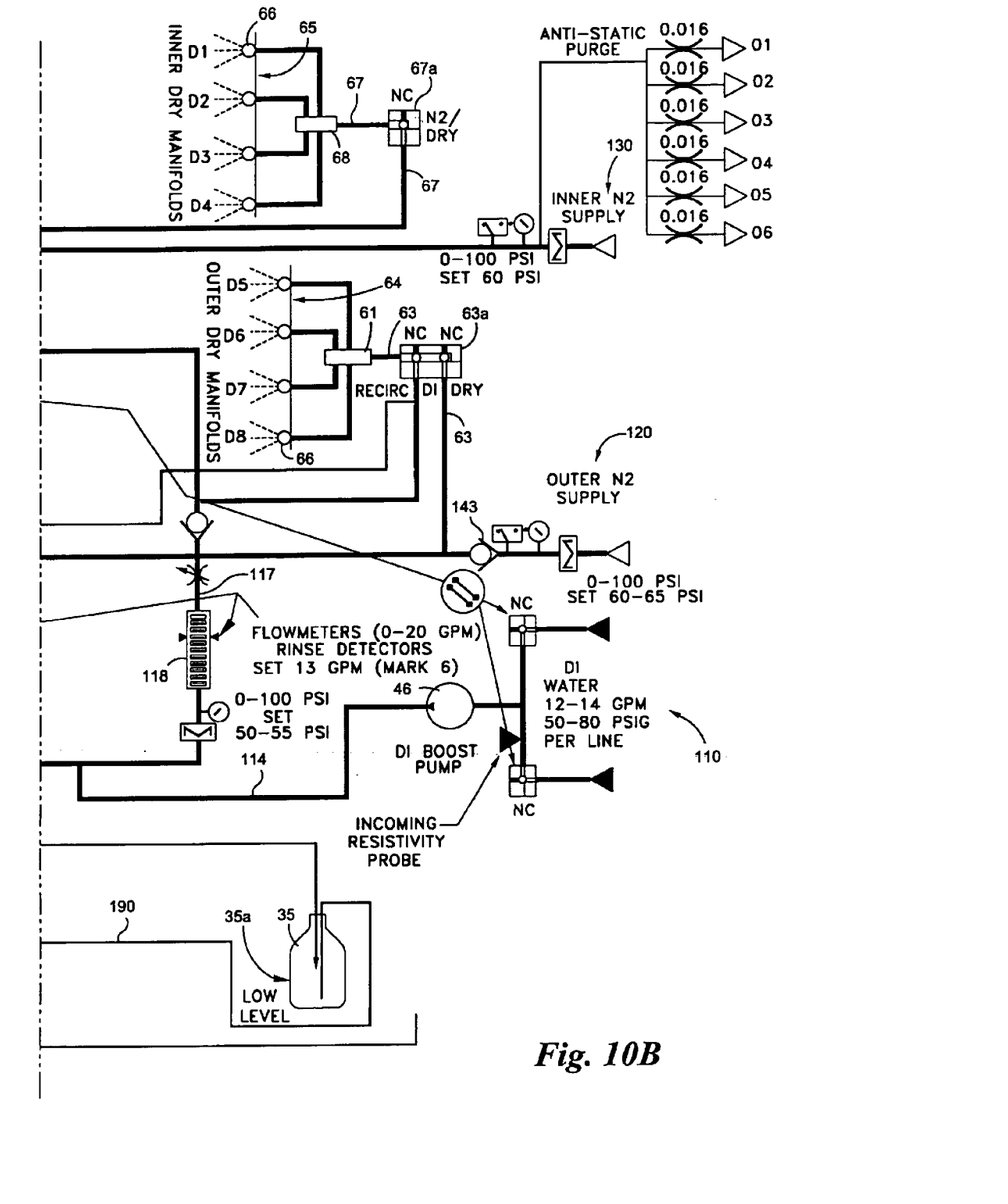
Figure 11:
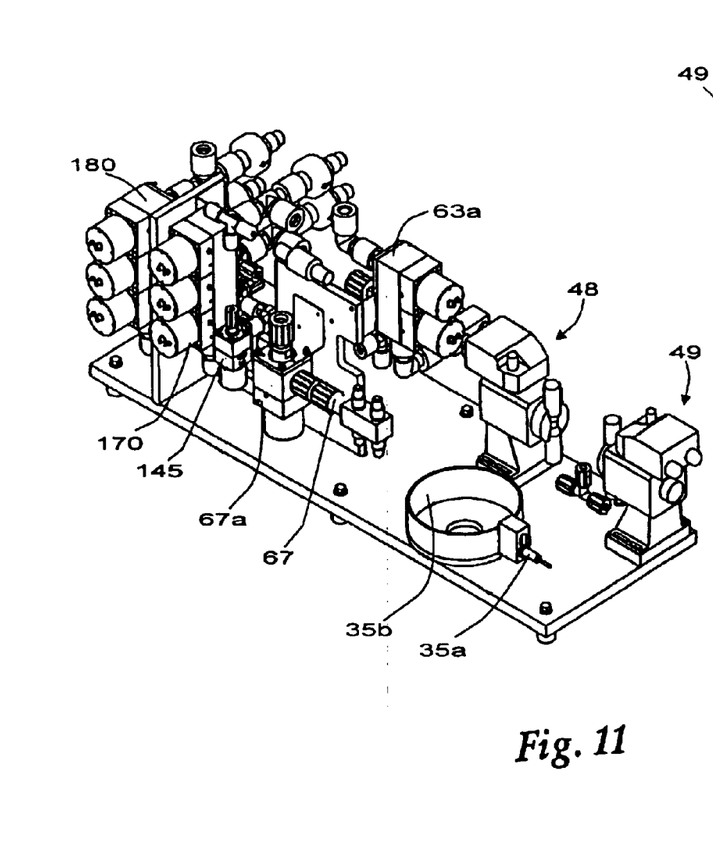
FIG. 11 is a left front side perspective view of a preferred configuration for the pumping and control valve system of FIG. 10.
Figure 12:
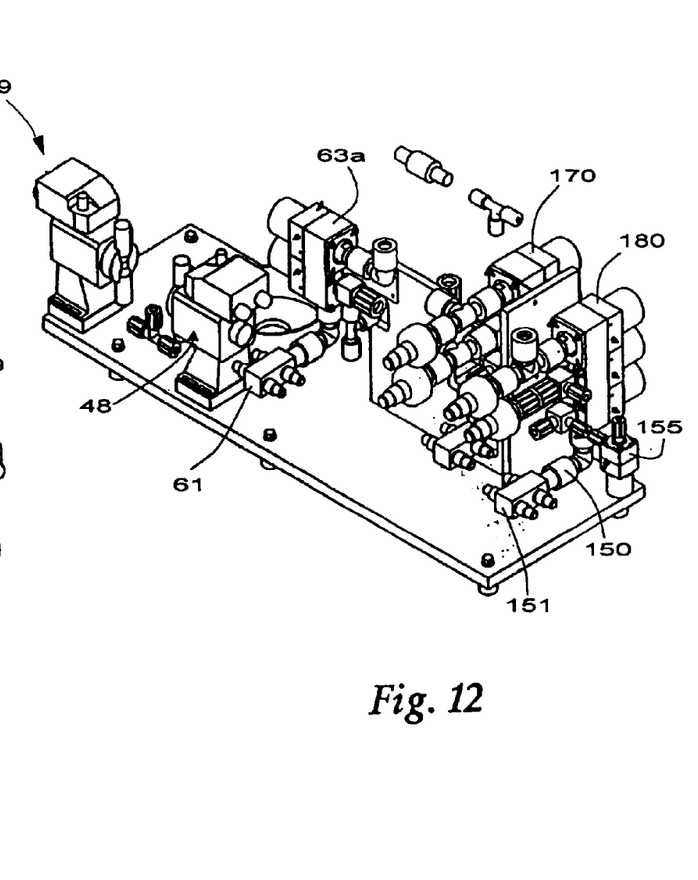
FIG. 12 is a rear right side perspective view of the configuration of FIG. 11.

Referring momentarily to FIG. 10, the outer dry manifolds 64 are connected via a distribution manifold 61 and then by fluid lines 63 to a supply 120 of pressurized gas such as air or nitrogen via control valve 63a. Similarly, the inner dry manifolds 65 are connected via a distribution manifold 68 and then by fluid lines 67 to a pressurized gas supply 130 via control valve 67a. The outer rinse manifolds 28 are connected via a distribution manifold 141 then by fluid lines 140 to a control valve 170 and a source 110 of de-ionized (DI) water. The inner rinse manifolds 29 are connected via a distribution manifold 151 and then by fluid lines 150 to a control valve 180 and the DI-water source 110. Pressurized gas lines are also connected to the spray manifolds, for purging, via the control valves 170, 180. A boost pump 46 increases the water pressure of the DI-water from the external source 110 to the rinse manifolds 28 and 29.

The control valves 170, 180 are preferably mixing control valves which ensure that the surfactant is thoroughly mixed with the DI-water.

Referring to FIGS. 3–6, and 10–12, a surfactant tank or bottle 35 is connected to surfactant metering pumps 48 and 49 via a fluid line 190. The surfactant metering pump 48 is connected to the mixing control valve 170 via fluid lines 192. Pump 48 pumps surfactant from the tank or bottle 35 into the control valve 170 where it is mixed with the DI water for injection into the outer rinse manifolds 28 via fluid lines 140. The surfactant metering pump 49 is connected to the control valve 180 via fluid lines 194. Pump 49 pumps surfactant from the tank or bottle 35 into the control mixing valve 180 where it is mixed with the DI water for injection into the inner rinse manifolds 29 via fluid lines 150.

The drain opening 39 at the bottom of the chamber 24 leads to a diverter 90 which connects the drain opening 39 to either a reclaim tank 42 or to a facility waste drain 92.

On the surfactant side, a return line 142 from fluid line 192 proximate the mixing control valve 170 provides for priming of surfactant (under the control of control valve 145) back to vessel 35; and a return line 152 from fluid line 194 proximate the mixing control valve 180 provides for priming of surfactant (under the control of control valve 155) back to vessel 35. On the DI-water side, a recirculation line 147 from fluid line 115 proximate the mixing control valve 170 provides for recirculation of DI-water; and a recirculation line 157 from fluid line 117 proximate the mixing control valve 180 provides for recirculation of DI-water. The recirculation lines 147 and 157 provide a flow of water through the tool even when the tool is idle to prevent bacteria formation in lines and valves.

Referring momentarily to FIG. 9, air heaters 58 are provided within an air inlet plenum 56 behind the air filter box 18 and over the center or inlet opening 37 leading into the top of the chamber 24. Blanket heaters 55 are also provided around the top of the chamber 24. A computer/controller 112 is linked to and controls the various pumps, valves, heaters, and flow sensors.

Referring to FIGS. 6–9, a rotor 70 is rotatably supported within the chamber 24 on a base 104. The rotor has a top ring 72 and a bottom ring 74 connected by a frame work 75. Ladders 76 are pivotally supported on upper and lower ladder supports 82 extending radially outwardly from the top ring 72 and the bottom ring 74. Each ladder 76 has a plurality of compartments 78 for holding containers or carriers 85, or container lids 87, as shown in FIG. 9. The configuration of the ladders 76 and the design of the compartments 78 on the ladders 76 are adapted for the specific sizes and types of carriers, containers, and lids to be cleaned. The entire rotor 70 is rotatably supported on a center column 100 and a rotor axle 106 within the center column 100. A rotor drive motor 102 spins the rotor 70. The detailed design features of the rotor 70, center column 100 and rotor axle 106 are well known, and are described in U.S. Pat. No. 5,224,503, incorporated herein by reference. Alternately, the tool may be constructed with non-rotating ladders.

In use, the machine 10 is typically installed in a silicon wafer or other flat media manufacturing facility. As the wafers are moved through various processing steps, the carriers 85 become contaminated, and must be cleaned before wafers are replaced into the carriers. The door 16 or 16A of the machine 10 is opened. The rotor 70 is turned or indexed until a ladder 76 is aligned with the door. The ladder 76 is then turned 180° so that the empty compartments 78 can be accessed through the door 16. The carriers 85 are loaded into the compartments 78 and the ladder is turned back to its original position, so that the compartments 78 are facing to the inside of the chamber 24. The ladders 76 are preferably provided with a latch or detent to lock the ladders into the closed or operating position, with the compartments 78 facing the inside of the chamber 24. The next ladder 76 is then brought into alignment with the door, for loading, by turning the rotor 70 (by hand or via control of the rotor drive motor 102). Loading continues until all of the ladders 76 are filled.

A facilities panel 40 on the machine 10, as shown in FIG. 6, has connections to input de-ionized water and gas, e.g., nitrogen or air into the machine 10, and a connection for the waste drain 92, as well as gauges and valves for measuring and controlling fluid/gas flow.

The surfactant tank 35 is supplied with a detergent or surfactant, for example, Valtron DP 94001 (a high pH alkaline detergent) a preferred surfactant for removing photoresist. The term "surfactant" as used in this application means a surfactant or a detergent. The controller 112, via appropriate control of valves and pumps, delivers DI-water and surfactant into the mixing control valves 170, 180 to make a desired DI-water/surfactant mixture for injection into each of the rinse manifolds 28, 29. The DI-water boost pump 46 boosts the water pressure in the supply line 114 to deliver DI-water to both mixing control valve 170 and mixing control valve 180. A flow meter 116 is disposed in the fluid line upstream of the outer rinse mixing control valve 170 to measure the flow of DI-water being supplied thereto. Similarly, a flow meter 118 is disposed in the fluid line upstream of the inner rinse mixing control valve 180 to measure the flow of DI-water being supplied thereto.

The system is initially calibrated by using information from the flow meter 116 in combination with controls on the metering pump 48 to set a reasonably precise surfactant concentration for the DI-water/surfactant mixture for injection into the outer rinse manifolds 28. Similarly, the system is calibrated by using information from the flow meter 118 in combination controls on the metering pump 49 to set a reasonably precise surfactant concentration for the DI-water/surfactant mixture for injection into the inner rinse manifolds 29. Preferably, the solution is 1:10000 surfactant, with the balance being DI-water, for each of the manifolds, but having separate flow control/metering, the surfactant concentration levels may be individually set.

The metering pumps 48, 49 are preferably a type of positive displacement pump, such as a diaphragm pump. The flow rate of such a diaphragm pump may be adjusted my adjusting the pump stroke (which sets the pumping volume per stroke) and/or the pump speed (strokes per minute). The pumps are preferably set at a relatively high speed so that surfactant is delivered into the system at a less pulsed/intermittent manner.

The system operator may adjust the surfactant/DI-water concentration by adjusting the pump stroke (which sets the pumping volume per stroke) and/or the pump speed (strokes per minute).

Though the system may be operated by having a preset pumping rate for the metering pumps 48, 49 and surfactant/DI-water concentration, an electronic control system may be implemented, using inputs from flow meters 116, 118 and electronic control of the pumping rates of the metering pumps.

A low-level sensor 35a may be provided on the surfactant vessel 35 for alerting that the fluid level in the vessel is low and needs replacement. The sensor 35a may either be a liquid sensor inside the vessel, or capacitive sensor located outside the vessel, or some other suitable device. The sensor may just determine when the level has reached a particular (low) level, indicating time for surfactant replacement, or certain types of sensors may provide a signal corresponding to surfactant level. For example, the tray 35b (see FIG. 11) in which the vessel 35 is inserted may comprise a load cell supporting the surfactant vessel 35 to provide the weight of the vessel 35 with the change in weight of the vessel as determined by the load cell providing an indication of fluid level.

The controller 112 controls the rotor drive motor 102, causing the rotor 70 to spin in a first direction, at a low speed, e.g., 1–50 rpm. Via control of the pumps 46, 48, 49 and valves 170, 180, the DI-water/surfactant solution is sprayed onto the carriers 85 on the spinning rotor.

After a sufficient duration e.g., 3–10 minutes, the rotor 70 reverses direction while the surfactant solution spraying continues, for improved spray coverage. The inner rinse manifolds 29, located inside of the rotor 70, spray radially outwardly from the center of the chamber 24. The outer rinse manifolds 28, located around the chamber cylindrical side walls 25 spray radially inwardly toward the chamber center. This dual spray action, combined with bi-directional rotation of the rotor 70, provides virtually complete coverage of all surfaces of the containers 85.

After completion of application of the surfactant solution, the manifolds are purged by gas or nitrogen flowing through check valves 143, 153 and the control valves 170, 180 as shown in FIG. 10.

During the surfactant wash cycle, the diverter valve 90 is positioned to direct fluid to the facility waste drain 92. Typically, as the machine 10 begins the rinse cycle, the diverter 90 remains in position to connect the drain opening 39 to the facility waste drain 92. DI-water is sprayed onto the carriers 85 from all of the rinse manifolds (R1–R8), with the rotor 70 spinning in a first direction, and then reversing and spinning in the opposite direction, e.g., at from 1–50 rpm, preferably about 6 rpm. The heaters 58 are then turned on, and the rotor accelerated up to e.g., 300 rpm, so that water droplets on the containers 85 are centrifugally flung off of the containers, and the containers are dried. The blanket heaters 55 are located on the outside of the top of the chamber 24 and are on continuously, for warming the top of the chamber. The DI rinse water goes out the waste drain 92.

If desired, for example in a water circulation mode where DI-water (without surfactant) is circulated through the chamber, the diverter valve 90 may be switched to a position While the machine 10 is useful for cleaning various contaminants, the specific cleaning parameters, such as duration of surfactant, rinse water, and air/gas spray, rotation speeds and sequences, heater operation, surfactant concentration, etc., may be varied somewhat to achieve optimum results, with different containers and contaminants, as would be apparent to one skilled in the art from the descriptions herein.

The machine enables use of highly concentrated cleaning solutions, such as surfactants, detergents, and ozonated DI-water, for cleaning containers. Solvents, although not ordinarily preferred, could also be used. Surfactants are generally not flammable or explosive, and do not have the same environmental disadvantages associated with solvents. On the other hand, surfactants can be very expensive, e.g., $40/gallon. Using the metering pumps to produce a precise and consistent concentration of surfactant for the DI-water/surfactant mixture, the system conserves surfactant. The system may also use the surfactant reclamation techniques of U.S. Pat. No. 6,432,214, hereby incorporated by reference.

Thus, a novel cleaning machine and method has been shown and described. Various changes can, of course, be made without departing from the spirit and scope of the invention.

The invention, therefore, should not be restricted, except to the following claims and their equivalents.

We claim:

1. An apparatus for cleaning wafer boxes comprising:
a rotor within a chamber, with the rotor having a plurality of compartments for holding wafer boxes;
a wafer box in one or more of the compartments;
an array of nozzles arranged to spray gas or de-ionized water onto a box on the rotor;
a mixer connected by a fluid line to one or more of the nozzles;
a de-ionized water inlet line for providing de-ionized water to the mixer;
a detergent source;
a detergent injection line connecting the detergent source to the mixer; and
a metering pump in the detergent injection line for pumping detergent from the detergent source to the mixer at a controllable pumping rate.

2. An apparatus according to claim 1 further comprising a housing around the chamber.

3. An apparatus according to claim 1 further comprising a boost pump connected to the water source for providing a desired inlet water pressure to the water inlet line.

4. An apparatus according to claim 1 further comprising a recirculation line connected between the water inlet line and a water source for providing a recirculation path for water back to the water source.

5. An apparatus according to claim 1 wherein the mixer comprises a mixing control valve for mixing the water and detergent.

6. An apparatus for cleaning media carriers, comprising:
a rotor within a chamber;
a plurality of carrier holding positions on or in the rotor;
a media carrier in one or more of the carrier holding positions;
a spray manifold having nozzles in the chamber arranged to spray gas or de-ionized water towards the rotor;
a control valve connected by a fluid line to the spray manifold;
a de-ionized water inlet line for providing de-ionized water to the control valve;
a detergent source;
a detergent injection line connecting the detergent source to the control valve;
a metering pump associated with the detergent injection line; and
means for controlling a pumping rate of the metering pump to produce a desired detergent concentration in the detergent/de-ionized water mixture provided to the spray manifold.

7. An apparatus according to claim 6 further comprising a flow meter associated with the water inlet line for measuring a flow rate of water provided to the control valve.

8. An apparatus according to claim 6 wherein the control valve comprises a mixing control valve for mixing the detergent and the water.

9. An apparatus according to claim 6 further comprising a recirculation line connected between the water inlet line proximate the control valve and a water source for providing a recirculation path for water back to the water source.

10. An apparatus according to claim 6 wherein the metering pump comprises a positive displacement diaphragm pump, and wherein said means for controlling a pumping rate of the metering pump comprises means for adjusting pumping speed.

11. An apparatus according to claim 10 wherein said means for controlling pumping rate of the metering pump further comprises means for adjusting pump stroke length.

12. An apparatus for cleaning flat media carriers, comprising:
a rotor mounted to spin within a chamber;
an array of nozzles arranged to spray a mixture of water and a cleaning solution toward the rotor;
a control valve connected by a fluid line to one or more of the nozzles;
a water inlet line for providing water to the control valve;
a cleaning solution source;
a cleaning solution supply line connecting the cleaning solution source to the control valve;
a metering pump associated with the supply line for pumping cleaning solution from the cleaning solution source to the control valve at a controllable pumping rate; and
a return line connecting the supply line and the cleaning solution source for providing a return path for cleaning solution back to the cleaning solution source.

13. An apparatus for cleaning media carriers, comprising:
a rotor mounted to spin within a chamber;
a spray manifold having nozzles arranged to spray a mixture of water and a cleaning solution towards the rotor;
a control valve connected by a fluid line to the spray manifold;

a water inlet line for providing water to the control valve;

a cleaning solution source;

a cleaning solution supply line connecting the cleaning solution source to the control valve;

a return line connected between the cleaning solution supply line and the cleaning solution source;

a metering pump associated with the cleaning solution supply line; and means for controlling pumping rate of the metering pump to produce a desired cleaning solution concentration in the cleaning solution/water mixture provided to the spray manifold.

14. The apparatus of claim 13 further comprising a return line connected between the cleaning solution supply line and the cleaning solution source, and a return line valve in the return line.

15. The apparatus of claim 13 wherein the cleaning solution source comprises a detergent source, a surfactant source, and/or an ozonated water source.

16. An apparatus for cleaning flat media carriers, comprising:

a rotor rotatably mounted within a chamber;

a plurality of spaces on the rotor for holding a carrier;

a carrier in one or more of the spaces;

a plurality of nozzles arranged to spray a mixture of de-ionized water and a cleaning solution toward the rotor;

a mixing valve connected by a fluid line to one or more of the nozzles;

a de-ionized water line for providing de-ionized water to the mixing valve;

a cleaning solution source;

a supply line connecting the cleaning solution source to the mixing valve; and a pump associated with the supply line for pumping cleaning solution from the cleaning solution source to the mixing valve at a controllable pumping rate.

17. An apparatus for cleaning wafer carriers, comprising:

a chamber;

a rotor rotatably supported in the chamber;

a plurality of carrier holding positions on the rotor;

a plurality of outer liquid spray nozzles arranged to spray inwardly toward the rotor;

a plurality of inner fluid spray nozzles arranged to spray outwardly toward the rotor;

a control valve connected by a fluid line to one or more of the spray nozzles;

a water inlet line for providing water to the control valve;

a cleaning solution source;

a supply line connecting the cleaning solution source to the control valve; and a metering pump for pumping cleaning solution from the cleaning solution source to the metering valve at a controlled pumping rate.

18. The apparatus of claim 17 wherein the cleaning solution source comprises a detergent sources a surfactant source, and/or an ozonated water source.

19. The apparatus of claim 17 further comprising a plurality of inner and outer drying gas spray nozzles, arranged to spray a drying gas outwardly and inwardly, respectively, toward the rotor.

* * * * *